United States Patent
Long et al.

(10) Patent No.: US 10,634,710 B1
(45) Date of Patent: Apr. 28, 2020

(54) GROUND NETWORK MONITORING SYSTEM

(71) Applicant: Wisk Aero LLC, Mountain View, CA (US)

(72) Inventors: Geoffrey Alan Long, Montara, CA (US); Jing Xue, San Jose, CA (US)

(73) Assignee: WISK AERO LLC, Mountain View, CA (US)

( * ) Notice: Subject to any disclaimer, the term of this patent is extended or adjusted under 35 U.S.C. 154(b) by 0 days.

(21) Appl. No.: 16/177,257

(22) Filed: Oct. 31, 2018

(51) Int. Cl.
*G01R 31/14* (2006.01)
*G01R 31/00* (2006.01)
*G01R 31/04* (2006.01)
*G01R 27/18* (2006.01)

(52) U.S. Cl.
CPC ............. *G01R 31/14* (2013.01); *G01R 27/18* (2013.01); *G01R 31/008* (2013.01); *G01R 31/04* (2013.01)

(58) Field of Classification Search
CPC ...... G01R 31/14; G01R 27/18; G01R 31/008; G01R 31/04
USPC .......................................................... 324/509
See application file for complete search history.

(56) References Cited

U.S. PATENT DOCUMENTS

| | | | | |
|---|---|---|---|---|
| 2,484,188 A | * | 10/1949 | Saville | H02J 13/0041 13/41 |
| 2,999,189 A | * | 9/1961 | Gerrard | H02H 5/105 361/50 |
| 6,396,279 B1 | * | 5/2002 | Gruenert | G01R 31/3272 324/418 |
| 2003/0164770 A1 | * | 9/2003 | Edge | G01R 27/14 340/635 |
| 2004/0254750 A1 | * | 12/2004 | Macfarlene | G01R 22/065 702/61 |
| 2010/0102826 A1 | * | 4/2010 | Edwards | G01R 31/024 324/543 |
| 2011/0038576 A1 | * | 2/2011 | Thornton | F16C 33/201 384/476 |
| 2013/0170077 A1 | * | 7/2013 | Dillig | H01H 83/02 361/18 |
| 2013/0221997 A1 | * | 8/2013 | Garcia Alvarrez | B60L 3/0069 324/709 |
| 2014/0049264 A1 | * | 2/2014 | Ganesh | G01R 31/025 324/551 |
| 2016/0154046 A1 | * | 6/2016 | Dong | G01R 31/025 324/509 |
| 2016/0238648 A1 | * | 8/2016 | Stechemesser | G01R 31/021 |
| 2016/0349305 A1 | * | 12/2016 | Pal | G01R 31/025 |

(Continued)

*Primary Examiner* — Christopher P McAndrew
(74) *Attorney, Agent, or Firm* — Kilpatrick Townsend & Stockton LLP

(57) ABSTRACT

Techniques to monitor a ground network are disclosed. In various embodiments, a test current is supplied to a ground connection from an electronic subsystem to a star point of a ground network. A voltage meter is used to read the potential difference between the ground connection and the voltage reference while the test current is being supplied to the ground connection to the star point of the ground network. The read potential difference is used to compute a computed resistance associated with the ground connection to the star point of the ground network. The computed resistance is used to determine that a detection criterion associated with the health of the ground connection to the star point of the ground network has been satisfied.

21 Claims, 5 Drawing Sheets

(56) References Cited

U.S. PATENT DOCUMENTS

2017/0131337 A1* 5/2017 Barlini .................. B60L 3/0023
2017/0269160 A1* 9/2017 Radler ............... G01R 31/3271

* cited by examiner ly conductive than aluminum, so it is not as straightfor-
GROUND NETWORK MONITORING SYSTEM

BACKGROUND OF THE INVENTION

Aircraft and other complex systems may include many subsystems that include electronics. These electronic subsystems can be distributed across the aircraft or other complex system and usually require power supplied by a central source. Many of the subsystems may be connected via communications links. For robust communications, it can be important for the chassis of all of the electronics enclosures that house these subsystems to be connected to a common ground that provides a single voltage reference. If these chassis connections are corrupted or broken, it can cause electromagnetic interference (EMI) related communications issues in systems where communication happens over electrical links.

Communication links between electronic enclosures may be considered critical. In the case of a "fly by wire" aircraft, for example, the safety of the aircraft may be considered dependent on robust communications between electronic subsystems. Where electrical based communications are used between subsystems, robust communications require a healthy ground network to link all of these subsystems.

BRIEF DESCRIPTION OF THE DRAWINGS

Various embodiments of the invention are disclosed in the following detailed description and the accompanying drawings.

DETAILED DESCRIPTION

Figure 1A:
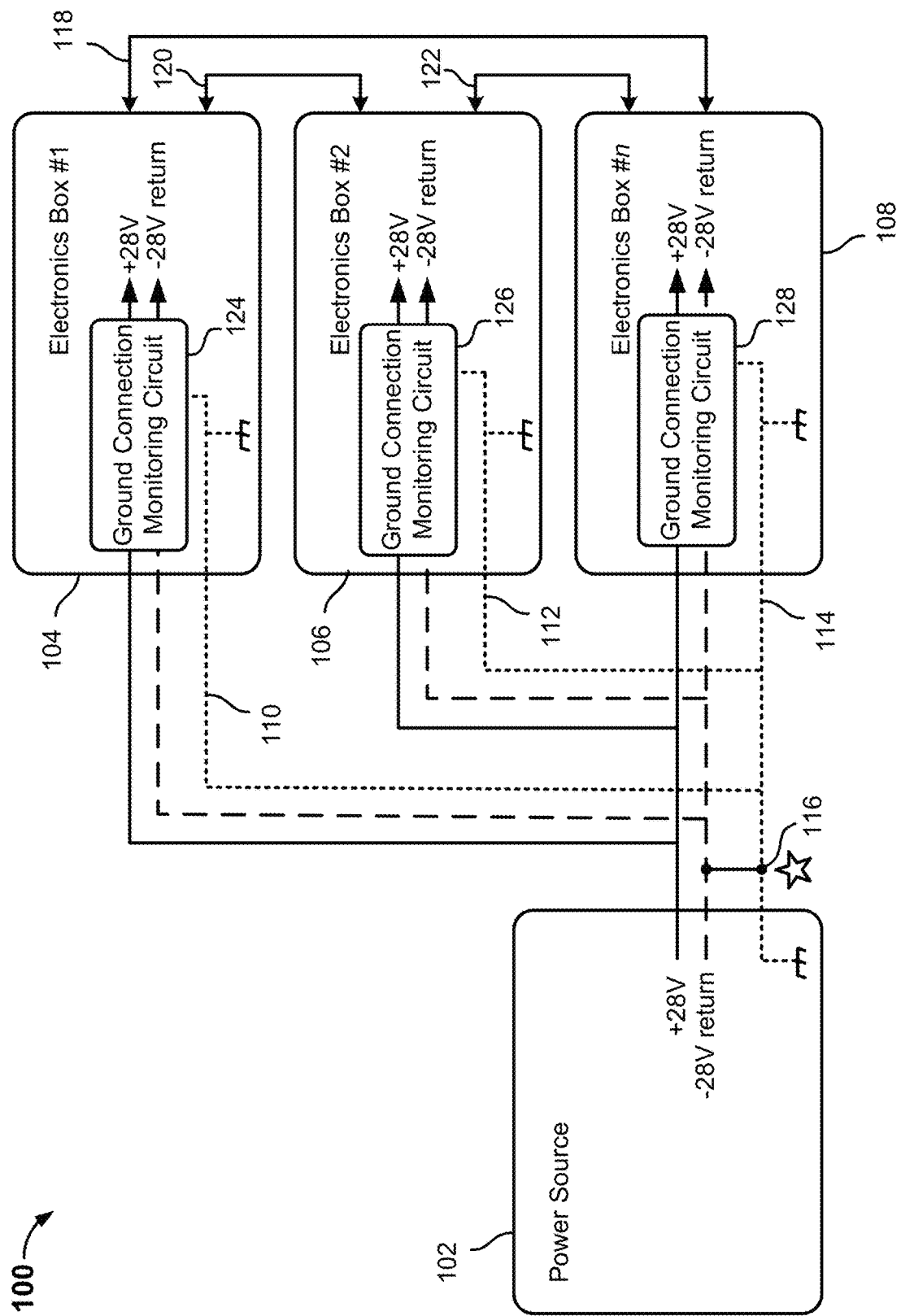
FIG. 1A is a block diagram illustrating an embodiment of a ground network monitoring system.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Techniques to monitor the health of a ground network are disclosed. In various embodiments, the resistance of a ground wire coupling an electronics disclosure to a remote reference point, such as a "star" point, is measured. The measure resistance is used to determine whether a detection criterion is satisfied. For example, the measure resistance may be compared to a detection threshold resistance and/or to a reference resistance for the connection. If the detection criterion is met, a responsive action is taken.

As used herein, the term "ground network" refers to the method and equipment used to provide a common "chassis ground" reference to each electronic subsystem. The term "chassis" refers to the physical framework to which components of the electronic subsystem are mounted and/or within which they are housed.

In the case of aircraft, many aircraft have aluminum airframes, which are highly electrically conductive. In these aircraft, the airframe may be used as the "ground network" and each electronics enclosure may be electrically bonded to the airframe. This electrical ground bond can be implemented with a ground strap or wire that can be made easily inspected during routine maintenance. If redundancy is desired, multiple fasteners can be used.

In more modern aircraft, the use of carbon fiber composites has become more common. Carbon fiber is less electri-ward to just use the airframe as the ground network. In some cases, when the aircraft is designed to withstand lightning strike, a copper or aluminum mesh can be included in the carbon fiber composite layup to enhance the electrical conductivity. For these aircraft, this mesh can be used to electrically connect all of the airframe pieces and electronics enclosures together. In this case, the conductive mesh is the ground network.

In some cases, the electrical cables that supply power to the electronics boxes will also include either a ground wire, or an overbraid that is connected to the backshells of the connectors, which are then electrically bonded to the enclosures. In these cases, the ground wires or ground braids comprise the ground network. The system is sometimes architected such that these ground wires/braids are electrically connected to the power supply return (a.k.a "power supply ground") at a single "star point" near the source of the power. Having a single "star point" prevents ground loops that can pick up noise and cause EMI issues in the various electronics boxes.

For carbon fiber or other composite aircraft that do not include a cooper or aluminum mesh, and for which communication between subsystems is provided using electrical links (which can be more susceptible to being damaged or disrupted by EMI than fiber optic links, for example) and is considered flight critical, in various embodiments techniques disclosed herein are used to ensure that ground connections, e.g., to a "star" point as described above, remain healthy. In some embodiments, techniques disclosed herein are used to monitor the health of a ground network in an aircraft or other system powered by a high voltage battery, which can cause large potentials across the airframe or other structures in off-nominal cases, e.g. where there is an AC short between the airframe (or other structure) and high voltage, which can cause large amounts of EMI.

In some embodiments, techniques disclosed herein are used in the context of an electrically-powered, fly-by-wire aircraft to monitor and determine the health of the ground network prior to every flight, e.g., in an aircraft that includes numerous nodes (e.g., electronic subsystems) connected to ground via the ground network, making manual evaluation prior to each flight impractical.

FIG. 1A is a block diagram illustrating an embodiment of a ground network monitoring system. In the example shown, 28V power is supplied from a power source 102 to each of a plurality of electronics subsystems, represented in FIG. 1A by electronics boxes 104, 106, and 108. Each of the electronics boxes 104, 106, and 108 has a corresponding ground wire, 110, 112, and 114, respectively, which connects the electronics box to a common star point 116, located in this example near the power supply 102.

In the example shown, the electronics boxes 104, 106, and 108 communicate with each other via communications links 118, 120, and 122. In some embodiments, communications links 118, 120, and 122 comprises electrical wire links susceptible to EMI as described above.

Each of the electronics boxes 104, 106, and 108 includes a corresponding ground connection monitoring circuit (124, 126, and 128, respectively). In various embodiments, the ground connection monitoring circuit 124, 126, 128 is used to pass current from the 28 V supply through the wire 110, 112, 114 connecting the electronics box 104, 106, 108 to the star point 116 of the ground network.

In various embodiments, the ground connection monitoring circuit 124, 126, 128 measure the voltage difference between the 28 V return and the wire 110, 112, 114 and uses the measured voltage to compute a computed resistance of the wire 110, 112, 114 between the electronics box 104, 106, 108 and the star point 116 of the ground network. If the computed resistance exceeds a detection threshold (or, in some embodiments, if another detection criterion is met), the wire 110, 112, 114 is determined to be potentially unhealthy and responsive action is taken.

Figure 1B:
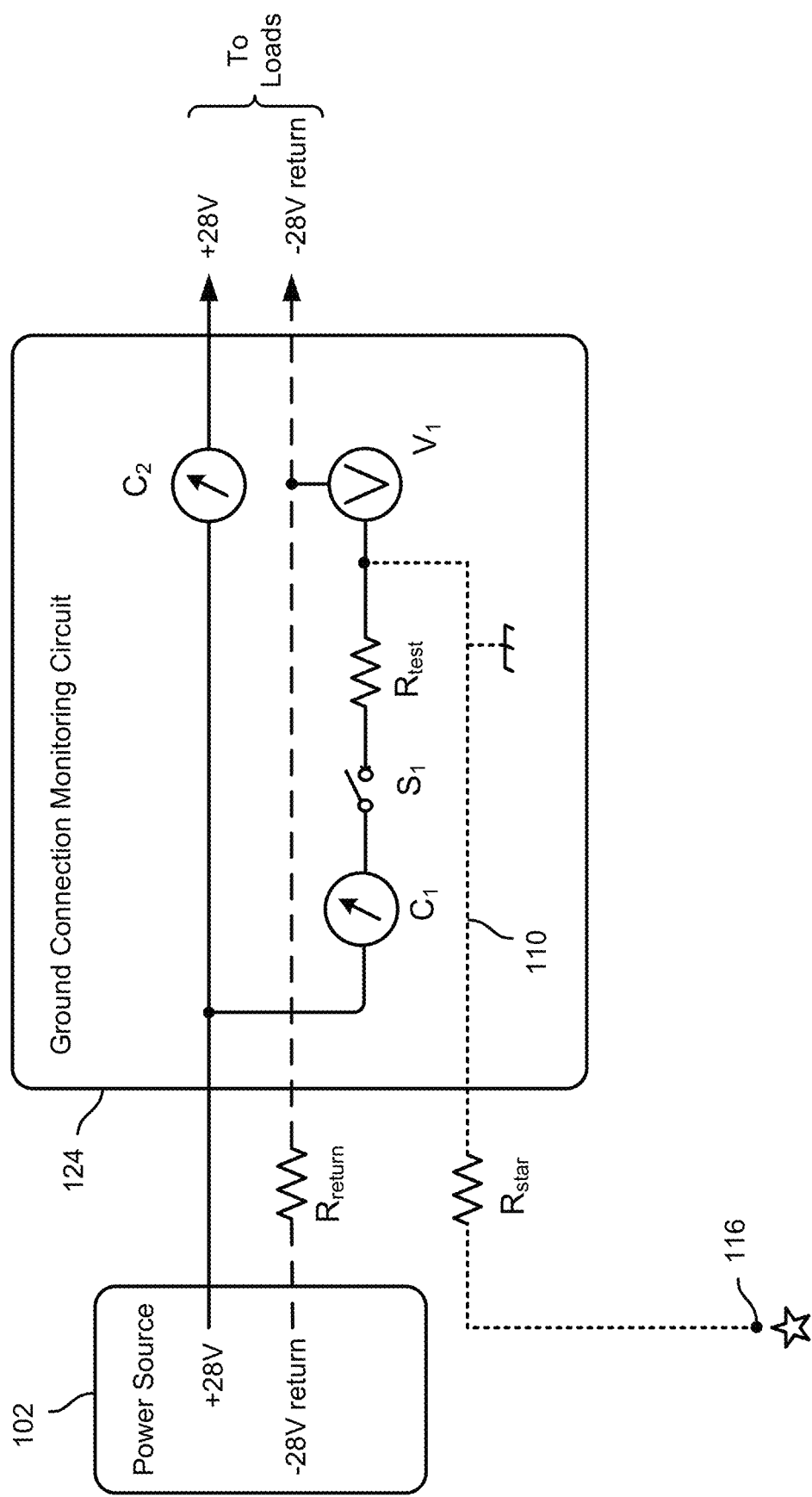
FIG. 1B is a block diagram illustrating an embodiment of a ground network monitoring circuit.

FIG. 1B is a block diagram illustrating an embodiment of a ground network monitoring circuit. In various embodiments, the ground connection monitoring circuit shown in FIG. 1B is used to implement the ground connection monitoring circuit 124, 126, 128 of FIG. 1A.

In the example shown in FIG. 1B, the ground connection monitoring circuit 124 is configured to use the 28V power that is supplied to electronics box 104 to pass current (current C1 in FIG. 1B, measured by an ammeter or other current meter, as shown) through the wire 110 connecting electronics box 104 to the star point 116 of the ground network by closing switch S1.

Under conditions in which the 28V return wire has no current passing through it, e.g., because no component or circuit that uses the 28V power supply is active, the 28V return wire can be used to measure the voltage drop along the wire 110 connecting the electronics box 104 to the star point 116 of the ground network using the voltage sensor V1 shown in FIG. 1B. A resistor Rtest is provided to limit the current to a value that avoids excessive energy loss, damage to any component or circuit, and/or blowing any fuse or other structure used to protect such components or circuits.

In some embodiments, Rtest equals approximately 10 ohms. In various embodiments, Rtest is in the 5-100 ohm range.

In the case where the rest of the electronics in the box 104 do not draw any power from the 28V supply 102, the resistance of the wire 110 connecting the box 104 to the star point 116 of the ground network is simply found from Ohm's law: Rstar=V1/C1. In various embodiments, if Rstar falls within acceptable bounds, the unit passes the test and the wire connecting the subsystem to the star point of the ground network is deemed healthy.

In a case in which the electronics box 104 is drawing power from the 28 V supply will the test is being performed, then there will be current flowing through the 28 V return wire, which results in a voltage drop across it. In some embodiments, a second current sensor (C2 in FIG. 1B) is included to account for this voltage drop. In this scenario, the resistance of the 28 V return wire would be measured a priori and known as Rreturn. The resistance of the ground wire 110 connecting the box 104 to the star point 116 of the ground network is then: Rstar=(V1−C2*Rreturn)/C1.

Figure 2A:
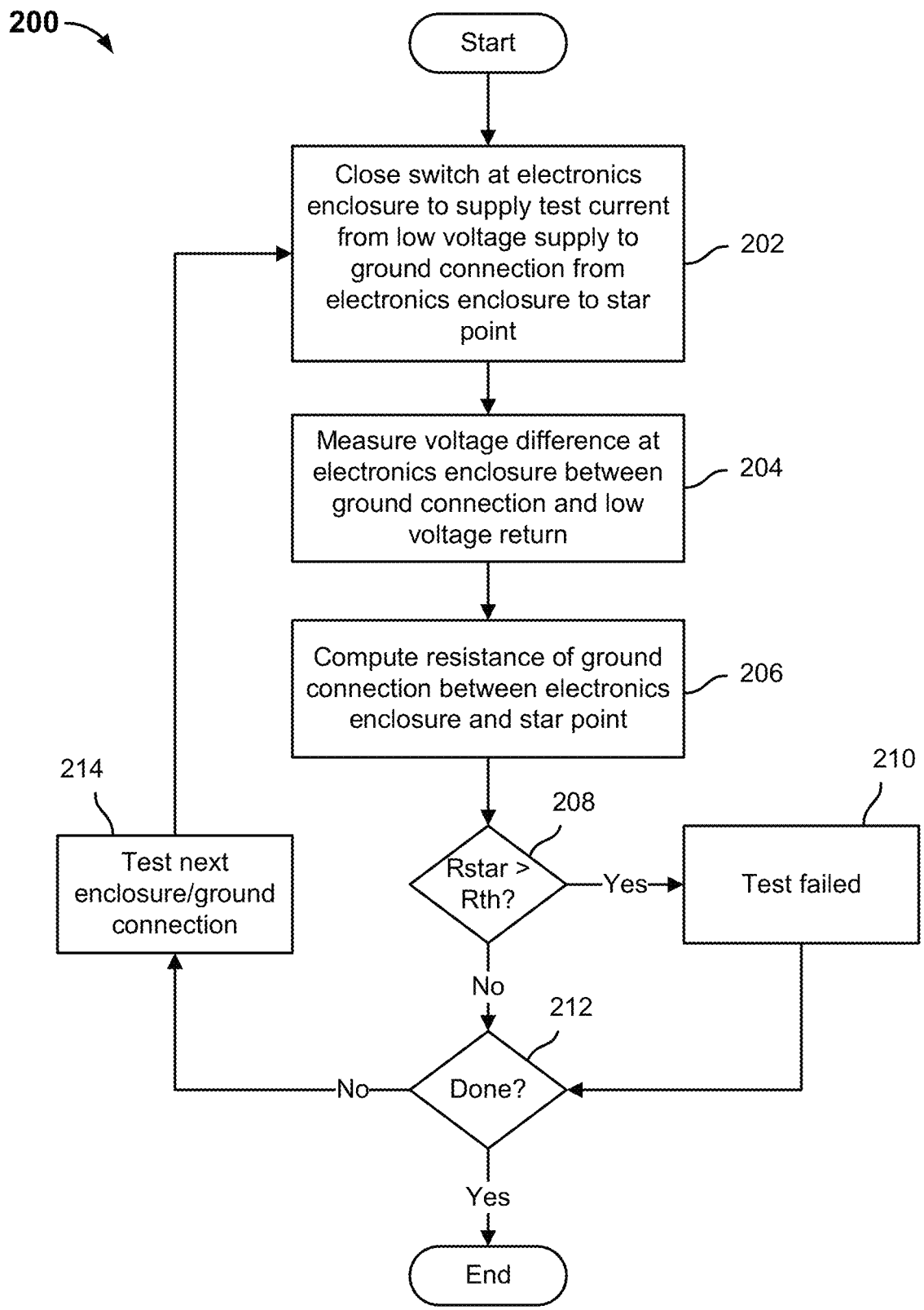
FIG. 2A is a flow chart illustrating an embodiment of a process to monitor a ground network.

FIG. 2A is a flow chart illustrating an embodiment of a process to monitor a ground network. In various embodiments, a ground connection monitoring circuit as disclosed herein, such as the ground connection monitoring circuits 124, 126, and 128 of FIGS. 1A and 1B is provide in each of plurality of electronic subsystems, each connected by a wire to a star point of a ground network. In various embodiments, a computer, processor, or other processing component, such as flight computer of an aircraft, is used to perform testing as disclosed herein to test each wire that connects one or more electronic subsystems (nodes, enclosures, chassis, etc.) to the star point of the ground network, e.g., by performing the process 200 of FIG. 2.

In the example shown, a processor or other hardware component implementing the process 200 of FIG. 2 closes a switch at the electronic subsystem (e.g., S1 in FIG. 1B) to supply a test current from a low voltage supply to the ground wire connecting the electronic subsystem to the star point of the ground network (202). A voltage difference is measure at the electronic subsystem between the ground wire connecting the electronic subsystem to the star point of the ground network and a low voltage return line (204). The measured voltage and supplied current are used to compute a resistance of the ground wire connecting the electronic subsystem to the star point of the ground network (206). If the computed resistance is greater than a detection threshold Rth (208), the test is determined to have been failed (210). If one or more further ground wires connecting electronic subsystems to the star point of the ground network remain to be tested (212), the process advances to testing a next one of the ground wires connecting an electronic subsystem to the star point of the ground network (214); otherwise (212), the process ends.

Examples of failure modes techniques disclosed herein may be used to detect include, without limitation, one or more of the following:

1. Chafing of the ground wire. In plausible scenarios, this is a gradual process. It would likely take many flights worth of vibration to slowly abrade through the many strands of copper that make up the ground wire.
2. High contact resistance where the ground wire is connected to chassis. In some places on the airplane, this happens with a sealed connector. In others a terminal lug is used. The likely degradation mechanism is due to corrosion, which should be a slow process that takes several flights before it becomes a problem.
3. A connector or terminal inadvertently not connected.

The second and third failure modes described above inherently result in high resistance between nodes of the ground network. In various embodiments, failure in either the second or third mode is detected at least in part by comparing the measured resistance of a wire connecting an electronic subsystem chassis (e.g., enclosure) to a star point of the ground network to a detection threshold. Responsive action is taken if the measured resistance exceeds the detection threshold.

With the first failure mode, the increase in resistance would typically be very small and difficult to measure if standard stranded copper wire were used. In some embodiments, a ground network as disclosed herein uses litz wire, in which the individual strands are each coated in enamel or other insulating material to insulate them from each, to connect electronic subsystems to a star point. Litz wire is typically used in cases where low AC impedance at high frequencies is needed. However, used in this context it has the added benefit of making the increase in resistance due to chafing much easier to measure because when individual strands break, the total resistance of the wire changes approximately proportional to the number of strands that break assuming a large number of strands are used. So if 5% of the strands break, the resistance will go up by approximately 5%. This is a measurable value and provides plenty of advance warning of an impending issue.

Figure 2B:
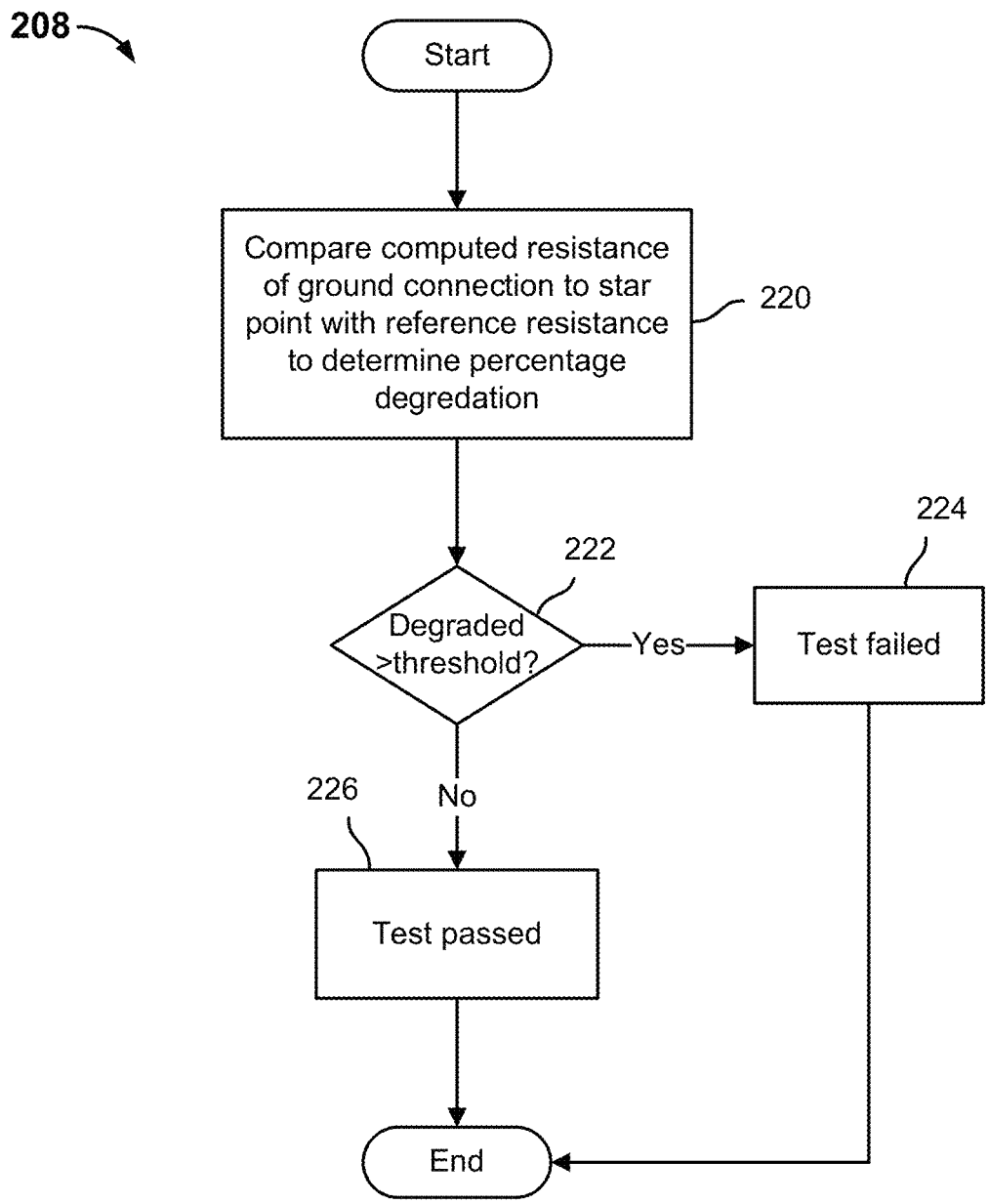
FIG. 2B is a flow chart illustrating an embodiment of a process to detect degradation of a ground connection in an embodiment of a ground network monitoring system.

FIG. 2B is a flow chart illustrating an embodiment of a process to detect degradation of a ground connection in an embodiment of a ground network monitoring system. In various embodiments, the process of FIG. 2B is used to detect degradation of a litz (or similar) wire that connects an electronic subsystem to the star point of the ground network. In the example shown, the computed resistance of the ground connection from the electronic subsystem to the star point of the ground network is compared to a reference resistance, e.g., the resistance of the same ground wire measured when the wire was considered to be healthy (e.g., new, with no or few broken strands) (220). If the comparison indicates degradation greater than a response threshold (222), the test is considered to have failed (224); otherwise, the test is considered to have been passed (226). For example, in some embodiments, if the computed resistance (220) is 5% greater than the reference resistance (222), the test is considered to have been failed (224).

Figure 3:
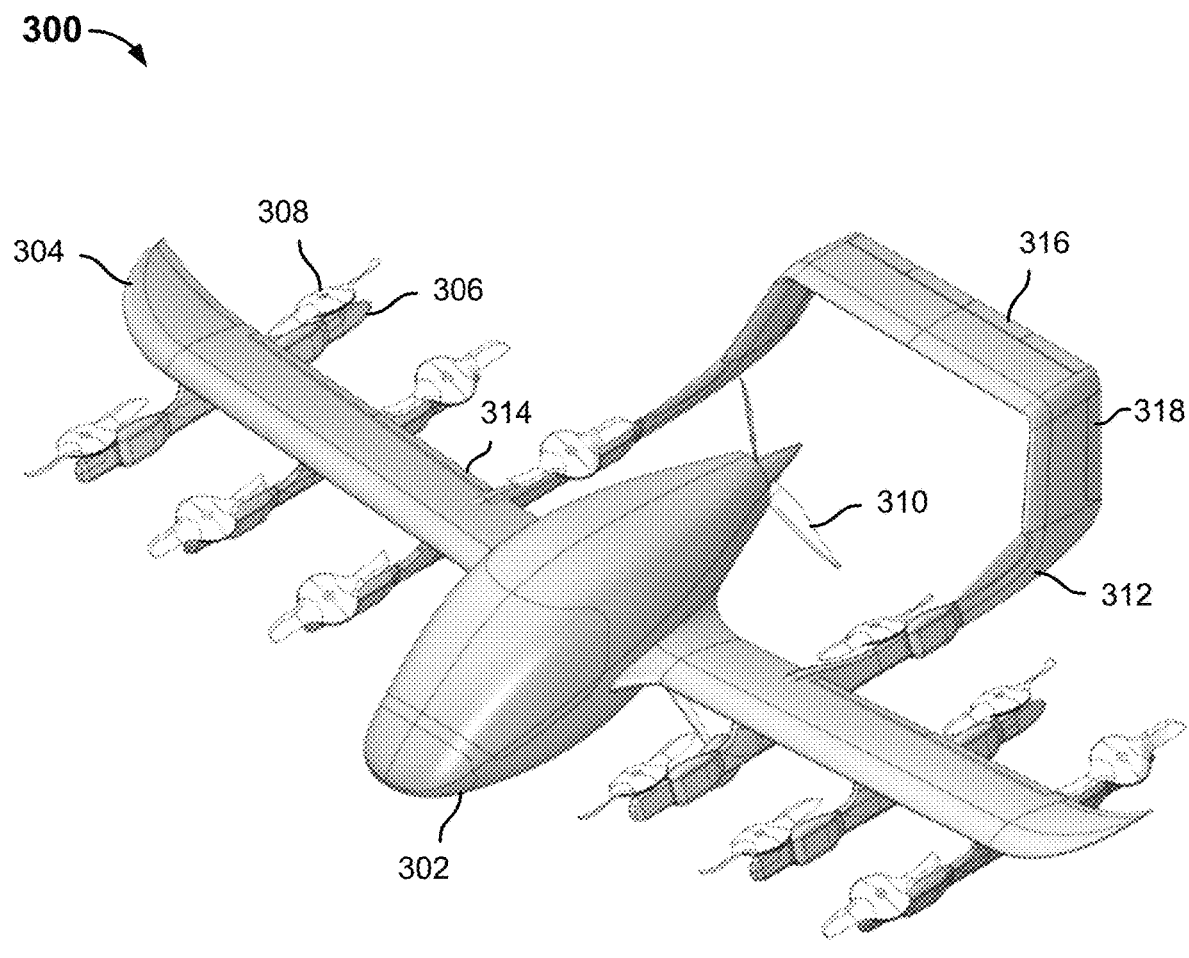
FIG. 3 is a diagram illustrating an embodiment of an aircraft comprising a ground network monitoring system.

FIG. 3 is a diagram illustrating an embodiment of an aircraft comprising a ground network monitoring system. In various embodiments, aircraft 300 of FIG. 3 comprises an electric VTOL aircraft that includes a ground network monitoring system as disclosed herein.

In the example shown, aircraft 300 includes a fuselage (body) 302 and wings 304. A set of three underwing booms 306 is provided under each wing. Each boom 306 has two lift fans 308 mounted thereon, one forward of the wing and one aft. Each lift fan 308 may be driven by an associated drive mechanism, such as a dedicated electric motor.

In the example shown in FIG. 3, propeller 310 is mounted on the fuselage 302 and configured to push the aircraft through the air in the forward (e.g., x axis) direction. The propeller 310 is positioned between a pair of booms 312 that extend aft and are joined at their aft end by a tail structure on which aerodynamic control surfaces including elevators 316 and rudder 318 are mounted. Additional control surfaces include ailerons 314 mounted on the trailing edge of wings 304.

A plurality of high voltage batteries (not shown in FIG. 3) may be used to drive the lift fans 308. The batteries and associated components may be located centrally, e.g., in fuselage 302, aft of the cockpit. Low voltage power supplies (e.g., 28 V power supply 102 of FIGS. 1A and 1B) may be provided and collocated centrally with the high voltage batteries. High voltage and low voltage power may be distributed to electrical and electronic components throughout the aircraft 300, e.g., by supplying 28 V power via supply and return lines as shown in FIGS. 1A and 1B. Power may be supplied to respective electronic subsystems associated with one or more of lift fans 308 and/or the respective motors driving the lift fans 308, propeller 310, and controls surfaces 314, 316, 318. Each electrical subsystem may have a ground wire connecting the electronic subsystem to a star point of a ground network, as described herein. In various embodiments, each of at least a subset of such electronic subsystems includes a ground connection monitoring circuit, as disclosed herein. A computer or processor, such as a flight computer, is configured in various embodiments to use the respective ground connection monitoring circuits, as disclosed herein, to monitor the health of wires connecting such electronic subsystems to the star point of the ground network. For example, such tests may be performed automatically prior to each flight.

In various embodiments, the aircraft 300 of FIG. 3 is constructed of carbon fiber composite materials and does not include a copper or other conductive mesh, e.g., because the aircraft 300 is not designed or intended to fly in lightening conditions. As such, the electronic subsystems of aircraft 300, and in particular the communications links connected them, may be subject to EMI as described herein, making the ground connections to the star point of the ground network of aircraft 300 potentially flight critical, as discussed above.

In some embodiments, aircraft 300 is an all-electrical aircraft. In some such embodiments, conservation of battery power may be a significant consideration. In some embodiments, the test resistance Rtest of FIG. 1B is selected to minimize power dissipation associated with monitoring the health of the ground connections from electronic subsystems to the star point of the ground network as disclosed herein. In embodiments where the test resistance Rtest is 10 ohms, the power dissipated in the resistor is nominally about $(28\ V)^2/(10\ ohm)=78$ W. The test duration can be very short (in some embodiments, 1 millisecond), to minimize power dissipation. In some embodiments, a DC/DC converter is used to step the voltage down to a lower level that can be used to generate the test current as disclosed herein. Some electronic subsystems may include such a DC/DC converter for other purposes and/or uses.

In some embodiments, a switch used to supply a test current to a ground connection from an electronic subsystem to the star point of the ground network, as described herein, e.g., switch S1 of FIG. 1B, may be switched on and off at some prescribed frequency. The frequency in some embodiments is relatively slow (100-1000 Hz), to reduce the effect of DC biases on the measurements to get better accuracy. In some embodiments, such an approach makes it possible to increase the test resistance Rtest substantially (e.g., above 50 ohm in some embodiments), while retaining sufficient litz resistance measurement accuracy. This is particularly true if the duty cycle is chosen to be something lower than 50% because the heating in the current limiting resistor and return wire would be reduced. For example, in some embodiments, the test resistor Rtest is chosen to be 50 ohm (a current of 0.56 amps and an instantaneous power of 16 W), and the "on" time of the switch is 10%, resulting in an average power dissipation in the resistor of about 1.6 W. In some embodiments, a switching frequency of 100 Hz is used and the test duration is 50 ms, which provides for 5 samples of 1 ms each, which are averaged to reduce noise.

In some embodiments, the switching frequency is chosen to be higher (100-200 kHz), to directly measure the impedance of the ground wire (not just the DC resistance). In some embodiments, the switching frequency is chosen to be close to the range of the switching frequency used in electronic subsystems where an AC short can occur, to more directly measuring the value that dictates the voltage drop between electronics boxes in an AC short event.

In some embodiments, the ground connection monitoring system is accurate enough to measure the ground wire resistance such that there's confidence that voltage differences are within acceptable limits. For example, if during an AC short failure about 20 amps of common mode current is expected to flow through the ground wire, in some embodiments the resistance to the star point is expected to be less than 50 milliohms in order to make sure the voltage drop across it is less than the 1 volt "requirement". In some embodiments, the wire connecting the electronic subsystem to the star point of the ground network is sized for about 40 milliohms and the system has the ability to measure the resistance to about 5 milliohms, leaving about 5 milliohms of margin to buy time to deal with a possible degradation situation.

In some embodiments, the test resistor Rtest is 10 ohms, which means the current will be approximately 2.8 amps. This current will result in a voltage drop of about 0.14 V across the 50 milliohm wire connecting the electronic subsystem to the star point of the ground network. In some embodiments, the voltage is measured with an accuracy of about 0.014V in order to meet the rough 10% accuracy "requirement". In some embodiments, this voltage is measured with about 1.4 millivolt accuracy and a test resistor Rtest of 100 ohms is used, resulting in a steady state dissipation of less than 8 W. In some such embodiments, a 10% duty cycle is used, reducing dissipation to less than a watt.

For electronic subsystems whose ground wire connection goes straight to the star point without sharing the wire with other subsystem, no consideration may be necessary for whether any other subsystems are simultaneously performing a ground connection monitoring test as disclosed herein, assuming the chassis impedance between electronic subsystems is much higher than the impedance to the star point.

For electronic subsystems that share ground wire connections to the star point of the ground network, ground connection monitoring tests as disclosed herein may need to be staggered such that only one subsystems that uses a share ground connection to the star point is performing the test at a time. For example, if the test requires 50 ms to perform, the test as performed by subsystems that share a ground connection to the star point are staggered in some embodiments at 100 ms intervals, to allow each electronic subsystem that shares the ground connection time to perform its test without interference by others, with a buffer before and after the test.

In various embodiments, techniques disclosed herein may be used to monitor the health of ground connections from electronic subsystems to the star point of a ground network, to ensure such connections remain healthy and to minimize the risk of EMI and the potential disruption of and/or interference with communications between electronic subsystems.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A ground network monitoring system, comprising:
a voltage meter configured to measure a potential difference between a ground connection from an electronic subsystem to a star point of a ground network and a voltage reference;
a switch configured to provide a test current from the electronic subsystem to the star point using the voltage reference; and
a processor coupled to the voltage meter configured to:
use the voltage meter to read the potential difference between the ground connection and the voltage reference at a time when the test current is being supplied in response to a determination that there is no current passing through a return wire between the voltage reference and a load;
use the read potential difference to compute a computed resistance associated with the ground connection to the star point of the ground network; and
use the computed resistance to determine that a detection criterion associated with health of the ground connection to the star point of the ground network has been satisfied.

2. The system of claim 1, wherein the processor is further configured to perform a responsive action based at least in part on the determination that the detection criterion associated with the health of the ground connection to the star point of the ground network has been satisfied.

3. The system of claim 1, wherein the test current is supplied by a power supply and wherein the voltage reference comprises a power supply return line associated with the power supply.

4. The system of claim 3, wherein the power supply is configured to supply power to a component comprising the electronic subsystem, resulting in a return current through the power supply return line, and wherein the processor is configured to take the return current into account in computing the computed resistance associated with the ground connection.

5. The system of claim 4, further comprising an ammeter or other current meter configured to measure the return current.

6. The system of claim 1, wherein the processor is coupled to the switch and is configured to provide the test current to the ground connection by closing the switch.

7. The system of claim 1, further comprising an ammeter or other current meter configured to measure the test current.

8. The system of claim 1, further comprising a test resistor connected to limit the test current.

9. The system of claim 8, wherein the test resistor is approximately 10 ohms.

10. The system of claim 8, wherein the test resistor is in the range of 5 to 100 ohms.

11. The system of claim 1, further comprising a DC to DC converter configured to provide a supply voltage used to provide the test current.

12. The system of claim 1, wherein the processor is configured to provide the test current to the ground connection.

13. The system of claim 1, wherein the processor is configured to provide the test current to the ground connection via the switch, including by cycling the switch between a closed position and an open position at a switching frequency.

14. The system of claim 1, wherein the detection criterion comprises a maximum resistance and using the computed resistance to determine that the detection criterion associated with the health of the ground connection to the star point of the ground network has been satisfied includes comparing the computed resistance to the maximum resistance.

15. The system of claim 1, wherein the ground connection comprises a litz wire or other wire comprising individually insulated strands, and wherein the detection criterion comprises a percentage increase in resistance associated with a corresponding degree of degradation of the ground connection.

16. The system of claim 1, wherein the electronic subsystem is included in a plurality of electronic subsystems, each having an associated ground connection to the star point, and wherein the processor is configured to provide a corresponding test current to each of ground connection, compute a computed resistance associated with each of said ground connections, and determine based on each computed resistance whether the detection criterion has been satisfied.

17. The system of claim 1, wherein two or more electronic subsystems in a plurality of electronic subsystems share at least a portion of a shared ground connection; and wherein said processor is configured to stagger testing of the respective ground connections of said electronic subsystems that share at least a portion of the shared ground connection.

18. A method to monitor a ground network, comprising:
supplying a test current from an electronic subsystem to a star point of a ground network by closing a switch;
using a voltage meter to read a potential difference between a ground connection from the electronic subsystem to the star point of the ground network and a voltage reference while the test current is being supplied in response to a determination that there is no current passing through a return wire between the voltage reference and a load;
using the read potential difference to compute a computed resistance associated with the ground connection to the star point of the ground network; and
using the computed resistance to determine that a detection criterion associated with health of the ground connection to the star point of the ground network has been satisfied.

19. A computer program product to monitor a ground network, the computer program product being embodied in a non-transitory computer readable medium and comprising computer instructions for:
supplying a test current from an electronic subsystem to a star point of a ground network by closing a switch;
using a voltage meter to read a potential difference between a ground connection from the electronic subsystem to the star point of the ground network and a voltage reference while the test current is being supplied in response to a determination that there is no current passing through a return wire between the voltage reference and a load;
using the read potential difference to compute a computed resistance associated with the ground connection to the star point of the ground network; and
using the computed resistance to determine that a detection criterion associated with health of the ground connection to the star point of the ground network has been satisfied.

20. The system of claim 1, wherein the ground network is at least one of an airframe and a metal mesh of a carbon fiber structure.

21. The system of claim 1, wherein the voltage reference is 28 V.

* * * * *